United States Patent
Tao et al.

(10) Patent No.: US 10,515,787 B2
(45) Date of Patent: Dec. 24, 2019

(54) OXIDE SINTERED BODY AND SPUTTERING TARGET, AND METHOD FOR PRODUCING SAME

(71) Applicants: KOBELCO RESEARCH INSTITUTE, INC., Kobe-shi (JP); KABUSHIKI KAISHA KOBE SEIKO SHO (KOBE STEEL, LTD.), Kobe-shi (JP)

(72) Inventors: Yuki Tao, Hyogo (JP); Kenta Hirose, Hyogo (JP); Norihiro Jiko, Hyogo (JP); Mototaka Ochi, Hyogo (JP)

(73) Assignees: KOBELCO RESEARCH INSTITUTE, INC., Kobe-shi (JP); KOBE STEEL, LTD., Kobe-shi (JP)

( * ) Notice: Subject to any disclaimer, the term of this patent is extended or adjusted under 35 U.S.C. 154(b) by 889 days.

(21) Appl. No.: 14/894,718

(22) PCT Filed: Nov. 28, 2014

(86) PCT No.: PCT/JP2014/081642
§ 371 (c)(1),
(2) Date: Nov. 30, 2015

(87) PCT Pub. No.: WO2015/080271
PCT Pub. Date: Jun. 4, 2015

(65) Prior Publication Data
US 2016/0111264 A1    Apr. 21, 2016

(30) Foreign Application Priority Data
Nov. 29, 2013 (JP) ................................ 2013-247763

(51) Int. Cl.
*H01J 37/34* (2006.01)
*C23C 14/08* (2006.01)
(Continued)

(52) U.S. Cl.
CPC .......... *H01J 37/3429* (2013.01); *C04B 35/01* (2013.01); *C04B 35/453* (2013.01);
(Continued)

(58) Field of Classification Search
CPC ............... C23C 14/086; C23C 14/3414; H01J 37/3429; H01J 37/3491; C04B 35/01;
(Continued)

(56) References Cited

U.S. PATENT DOCUMENTS 6,042,752 A * 3/2000 Mitsui .................. C23C 14/086
204/298.12
9,905,403 B2 * 2/2018 Tao ......................... C23C 14/08
(Continued)

FOREIGN PATENT DOCUMENTS

JP  05-311428  11/1993
JP  2000-77358  3/2000
(Continued)

OTHER PUBLICATIONS

International Search Report dated Feb. 25, 2015, for PCT/JP2014/081642 filed Nov. 28, 2014 (with English Translation).
(Continued)

*Primary Examiner* — Michael A Band
(74) *Attorney, Agent, or Firm* — Oblon, McClelland, Maier & Neustadt, L.L.P.

(57) ABSTRACT

An oxide sintered body is obtained by sintering indium oxide, gallium oxide and tin oxide. The oxide sintered body has a relative density of 90% or more and an average grain size of 10 μm or less. In the oxide sintered body, the relations 30 atomic %≤[In]≤50 atomic %, 20 atomic %≤[Ga]≤30 atomic % and 25 atomic %≤[Sn]≤45 atomic % are satisfied. [In], [Ga] and [Sn] are ratios of contents (atomic %) of indium gallium and tin, respectively, to all metal elements contained in the oxide sintered body. The oxide sintered
(Continued)

No. 1

No. 2 body has an InGaO$_3$ phase which satisfies the relation [InGaO$_3$]≥0.05.

19 Claims, 1 Drawing Sheet

(51) Int. Cl.
| | | |
|---|---|---|
| C23C 14/34 | (2006.01) | |
| C04B 37/02 | (2006.01) | |
| C04B 35/645 | (2006.01) | |
| C04B 35/01 | (2006.01) | |
| C04B 35/453 | (2006.01) | |
| C04B 35/457 | (2006.01) | |

(52) U.S. Cl.
CPC .......... *C04B 35/457* (2013.01); *C04B 35/645* (2013.01); *C04B 37/026* (2013.01); *C23C 14/086* (2013.01); *C23C 14/3414* (2013.01); *H01J 37/3491* (2013.01); *C04B 2235/3284* (2013.01); *C04B 2235/3286* (2013.01); *C04B 2235/3293* (2013.01); *C04B 2235/6562* (2013.01); *C04B 2235/6567* (2013.01); *C04B 2235/77* (2013.01); *C04B 2235/786* (2013.01); *C04B 2235/80* (2013.01); *C04B 2237/12* (2013.01); *C04B 2237/34* (2013.01); *C04B 2237/407* (2013.01)

(58) Field of Classification Search
CPC ... C04B 35/453; C04B 35/457; C04B 35/645; C04B 37/026
See application file for complete search history.

(56) References Cited

U.S. PATENT DOCUMENTS

| | | | |
|---|---|---|---|
| 10,090,136 B2* | 10/2018 | Tao | .......... C23C 14/08 |
| 2004/0222089 A1* | 11/2004 | Inoue | .......... C23C 14/086 |
| | | | 204/298.12 |
| 2011/0260118 A1* | 10/2011 | Yano | .......... C04B 35/457 |
| | | | 252/512 |
| 2012/0313057 A1 | 12/2012 | Itose et al. | |

FOREIGN PATENT DOCUMENTS

| | | |
|---|---|---|
| JP | 2008-280216 | 11/2008 |
| JP | 2011-174134 | 9/2011 |
| WO | WO 2011/105047 | 9/2011 |
| WO | WO 2013/027391 | 2/2013 |

OTHER PUBLICATIONS

Written Opinion dated Feb. 24, 2015 for PCT/JP2014/081642 filed Nov. 28, 2014 (with English Translation).

* cited by examiner

No. 1
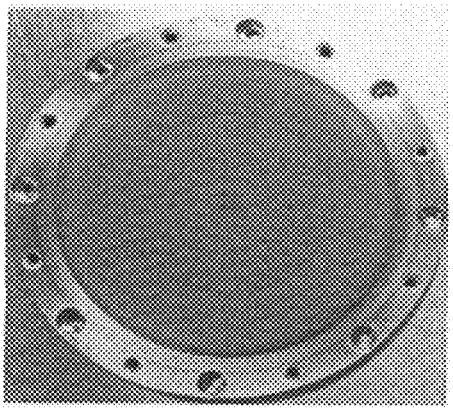
No. 2
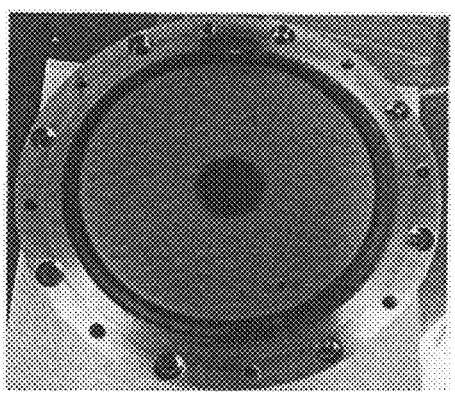

OXIDE SINTERED BODY AND SPUTTERING TARGET, AND METHOD FOR PRODUCING SAME

TECHNICAL FIELD

The present invention relates to an oxide sintered body and a sputtering target used when oxide semiconductor thin films of thin-film transistors (TFTs) to be used in display devices such as liquid crystal displays and organic EL displays are deposited by sputtering methods, and a method for producing the same.

BACKGROUND ART

Amorphous (non crystalline) oxide semiconductors for use in TFTs have higher carrier mobility and larger optical band gaps and can be deposited at lower temperatures as compared with general amorphous silicon (a-Si). Therefore, the amorphous oxide semiconductors are expected to be applied to next-generation displays which are required to have large sizes and high resolutions and to achieve high-speed drive; and to resin substrates which have low thermal stability. As compositions of oxide semiconductors suitable for these applications, In-containing amorphous oxide semiconductors have been proposed. For example, In—Ga—Zn-based oxide semiconductors, In—Ga—Zn—Sn-based oxide semiconductors, In—Ga—Sn-based oxide semiconductors and the like have been attracting attention.

For formation of a thin film of the above oxide semiconductor, a sputtering method has been preferably employed, in which a sputtering target (hereinafter sometimes referred to as a "target material") of the same material as the thin film is subjected to sputtering. The sputtering target is used in a state where an oxide sintered body is bonded to a backing plate. However, the oxide sintered body has sometimes been cracked in a step of bonding the oxide sintered body to the backing plate.

For example, Patent Document 1 discloses an oxide semiconductor film suitable for a patterning step in preparing a semiconductor device, and an oxide sintered body containing indium element (In), gallium element (Ga) and tin element (Sn) in atomic ratios of $0.10 \leq \text{In}/(\text{In}+\text{Ga}+\text{Sn}) \leq 0.60$, $0.10 \leq \text{Ga}/(\text{In}+\text{Ga}+\text{Sn}) \leq 0.55$ and $0.0001 \leq \text{Sn}/(\text{In}+\text{Ga}+\text{Sn}) \leq 0.60$, as an oxide sintered body which can deposit the above semiconductor film.

Patent Document 2 discloses an oxide sintered body containing indium element (In), gallium element (Ga), zinc element (Zn) and tin element (Sn), and containing a compound represented by $Ga_2In_6Sn_2O_{16}$ or $(Ga,In)_2O_3$, as a technique for reducing abnormal discharge during sputtering.

Moreover, Patent Document 3 discloses a sputtering target which is excellent in sputtering operability such as an increase in sputter rate, prevention of the occurrence of nodules and prevention of cracking, and possible to form a transparent conductive film particularly low in resistance in a low-temperature substrate; and a high density ITO sintered body having a sintered density of 90% or more and 100% or less and a sintered grain size of 1 μm or more and 20 μm or less, as an ITO sintered body for use in a target material.

CITATION LIST

Patent Documents

Patent Document 1: JP-A-2011-174134
Patent Document 2: JP-A-2008-280216
Patent Document 3: JP-A-05-311428

SUMMARY OF THE INVENTION

Technical Problems

With recent progress in performance of display devices, an improvement in properties and stabilization of the properties of oxide semiconductor thin films have been requested and also it is required to produce the display devices more efficiently. Moreover, in consideration of productivity, production costs and the like, it is further required for a sputtering target for use in the production of oxide semiconductor thin films for the display devices and an oxide sintered body as a raw material thereof not only to suppress cracking of the sputtering target in a sputtering step, but also to suppress cracking of an oxide sintered body in a bonding step.

The present invention has been made under these circumstances, and an object thereof is to provide an oxide sintered body which is preferably used for the production of oxide semiconductor thin films for display devices and an oxide sintered body which is a sputtering target and can suppress the occurrence of cracking in a bonding step, and a sputtering target using the oxide sintered body; and a method for producing the same.

Solution to Problems

The oxide sintered body of the present invention which could solve the above problems is an oxide sintered body obtained by sintering indium oxide, gallium oxide and tin oxide, in which the oxide sintered body has a relative density of 90% or more, the oxide sintered body has an average grain size of 10 μm or less, the following expressions (1) to (3) are satisfied when ratios of contents (atomic %) of indium, gallium and tin to all metal elements excluding oxygen, which are contained in the oxide sintered body are taken as [In], [Ga] and [Sn], respectively, and the oxide sintered body has an $InGaO_3$ phase which satisfies the following expression (4), as determined by X-ray diffractometry:

$$30 \text{ atomic \%} \leq [\text{In}] \leq 50 \text{ atomic \%} \quad (1)$$

$$20 \text{ atomic \%} \leq [\text{Ga}] \leq 30 \text{ atomic \%} \quad (2)$$

$$25 \text{ atomic \%} \leq [\text{Sn}] \leq 45 \text{ atomic \%} \quad (3)$$

$$[InGaO_3] \geq 0.05 \quad (4)$$

in which $[InGaO_3]=(I(InGaO_3)/(I(InGaO_3)+I(In_2O_3)+I(SnO_2))$, and in which $I(InGaO_3)$, $I(In_2O_3)$ and $I(SnO_2)$ are measured values of diffraction intensities of the $InGaO_3$ phase, an $In_2O_3$ phase and an $SnO_2$ phase, respectively, identified by X-ray diffractometry.

In a preferable embodiment of the present invention, a ratio of a coarse grain having a grain size exceeding 15 μm in the above oxide sintered body is 10% or less.

In a preferable embodiment of the present invention, the oxide sintered body has no $Ga_{3-x}In5_{+x}Sn_2O_{16}$ phase, as determined by X-ray diffractometry.

In a preferable embodiment of the present invention, the oxide sintered body has no $(Ga,In)_2O_3$ phase, as determined by X-ray diffractometry.

Moreover, the sputtering target of the present invention which could solve the above problems is a sputtering target obtained by using the oxide sintered body described in any one of the above, and has a resistivity of 1 Ω·cm or less.

A preferable method for producing the oxide sintered body of the present invention includes mixing indium oxide, gallium oxide and tin oxide, setting them in a forming die, then, elevating a temperature to a sintering temperature of 850 to 1250° C., and thereafter, performing sintering in a region of the temperature for a retention time of 0.1 to 5 hours under an applied pressure of 59 MPa or less.

In a preferable embodiment of the present invention, an average temperature-elevating rate up to the sintering temperature is 600° C./hr or less.

Advantageous Effects of the Invention

According to the present invention, it is possible to provide an oxide sintered body which can suppress the occurrence of cracking during a bonding operation and a sputtering target using the oxide sintered body, and a method for producing the same.

BRIEF DESCRIPTION OF THE DRAWINGS

FIG. 1 is photographs showing the presence or absence of a black deposit in No. 1 and No. 2 of Example 2.

DESCRIPTION OF EMBODIMENTS

The present inventors have invented an In—Ga—Sn-based oxide semiconductor thin film (IGTO) having metal elements in specific ratios described later, as an oxide semiconductor thin film excellent in TFT mobility evaluated by high carrier mobility, as compared with a conventional In—Ga—Zn-based oxide semiconductor thin film (IGZO), and have previously filed its application.

However, in an oxide sintered body as a raw material of a sputtering target used for the production of the In—Ga—Sn-based oxide semiconductor thin film (IGTO), it is also important to further suppress cracking of the oxide sintered body in a bonding step, in consideration of productivity, production costs and the like, and for this purpose, it becomes necessary to improve the oxide sintered body.

Then, the present inventors have made intensive investigations to suppress the cracking during bonding, for the oxide sintered body as the raw material of the In—Ga—Sn-based sputtering target suitable for deposition of the above oxide semiconductor thin film.

As a result, it has been found that an oxide sintered body obtained by mixing and sintering indium oxide, gallium oxide and tin oxide which have specific metal element ratios satisfying expressions (1) to (3) described later, (a) has an effect of suppressing the cracking of the oxide sintered body during the bonding by controlling the ratio of an $InGaO_3$ phase, as determined by X-ray diffractometry of the oxide sintered body, (b) can further improve the effect of suppressing the cracking of the oxide sintered body during the bonding by increasing the relative density, and (c) can still further improve the effect of suppressing the cracking of the oxide sintered body when the average grain size of the oxide sintered body is refined, thus leading to the present invention.

Further, it has been found that (d) it should be sufficient to perform sintering under predetermined sintering conditions in order to obtain the above oxide sintered body.

First, the constitution of the oxide sintered body according to the present invention will be explained in detail.

In order to form the oxide semiconductor thin film having excellent effects to TFT properties, it is necessary to appropriately control the contents of the individual metal elements contained in the oxide sintered body.

Specifically, when the ratios of the contents (atomic %) of the individual metal elements (indium, gallium and tin) to all metal elements excluding oxygen, which are contained in the oxide sintered body are taken as [In], [Ga] and [Sn], respectively, control is performed so as to satisfy the following expressions (1) to (3).

$$30 \text{ atomic \%} \leq [\text{In}] \leq 50 \text{ atomic \%} \quad (1)$$

$$20 \text{ atomic \%} \leq [\text{Ga}] \leq 30 \text{ atomic \%} \quad (2)$$

$$25 \text{ atomic \%} \leq [\text{Sn}] \leq 45 \text{ atomic \%} \quad (3)$$

The above expression (1) defines the In ratio ([In]=In/(In+Ga+Sn)) in all the metal elements. When [In] is too low, the effect of improving the relative density of the oxide sintered body or reduction in resistivity of the sputtering target cannot be achieved. Moreover, the carrier mobility of the oxide semiconductor thin film after deposition also decreases. On the other hand, when [In] is too high, not only carriers excessively increase to cause conversion into conductor, but also stability against stress decreases. Therefore, [In] is 30 atomic % or more, preferably 35 atomic % or more and more preferably 40 atomic % or more, and is 50 atomic % or less, preferably 47 atomic % or less and more preferably 45 atomic % or less.

The above expression (2) defines the Ga ratio ([Ga]=Ga/(In+Ga+Sn)) in all the metal elements. [Ga] not only decreases oxygen defects to stabilize an amorphous structure of the oxide semiconductor thin film, but also has a function of improving stress resistance (particularly, resistance against light+negative bias stress). However, when [Ga] is too high, the mobility decreases. Therefore, [Ga] is 20 atomic % or more, preferably 22 atomic % or more and more preferably 24 atomic % or more, and is 30 atomic % or less, preferably 29 atomic % or less and more preferably 28 atomic % or less.

The above expression (3) defines the Sn ratio ([Sn]=Sn/(In+Ga+Sn)) in all the metal elements. [Sn] has a function of improving chemical resistance of the oxide semiconductor thin film, such as wet etching properties. However, with an improvement in chemical resistance, the etching rate decreases, so that when [Sn] is too high, etching workability deteriorates. Therefore, [Sn] is 25 atomic % or more, preferably 26 atomic % or more and more preferably 27 atomic % or more, and is 45 atomic % or less, preferably 40 atomic % or less and more preferably 35 atomic % or less.

The oxide sintered body of the present invention is composed of In, Ga and Sn as metal elements in the above ratios, and contains no Zn. This is because when a thin film is deposited by using a conventional IGZO target containing In, Ga and Zn, composition deviation increases between the IGZO target and an IGZO film, and it has become clear that a black deposit composed of Zn and O is formed on a surface of the IGZO target, as explained in the Example described later. The above black deposit is separated from the target surface during sputtering to form particles, thereby causing arching and the like. This leads to a major problem in terms of deposition.

Here, the main reason for the occurrence of the above problem when the IGZO target is used is considered to be caused by that the vapor pressure of Zn is high compared with those of Ga and In. For example, in the case where the thin film is deposited by using the target, it is recommended to perform pre-sputtering with only an oxygen-free inert gas such as argon, and thereafter to perform sputtering in an inert atmosphere containing oxygen having a predetermined partial pressure, in consideration of costs. However, when Zn is reduced during the above pre-sputtering, Zn becomes easy to evaporate because of its high vapor pressure to adhere to the target surface, thereby forming the black deposit. As a result, the composition deviation between the target and the film is induced, and the atomic ratio of Zn in the film substantially decreases compared with that in the target.

The oxide sintered body of the present invention is preferably composed of indium oxide, gallium oxide and tin oxide satisfying the above predetermined metal element contents, the remainder being impurities such as oxides unavoidably formed during production.

Next, the $InGaO_3$ phase detected as determined by X-ray diffractometry of the above oxide sintered body will be explained. The $InGaO_3$ phase is an oxide formed by bonding of In and Ga which constitute the oxide sintered body of the present invention. The $InGaO_3$ phase has an effect of suppressing the cracking due to stress during the bonding, in the oxide sintered body of the invention.

In order to obtain the oxide sintered body having such an effect, it is necessary that the peak strength of the $InGaO_3$ phase identified by X-ray diffractometry satisfies the following expression (4):

$$[InGaO_3] \geq 0.05 \quad (4)$$

with the proviso that $[InGaO_3]=(I(InGaO_3)/(I(InGaO_3)+I(In_2O_3)+I(SnO_2)))$, in which $I(InGaO_3)$, $I(In_2O_3)$ and $I(SnO_2)$ indicate measured values of diffraction intensities of the $InGaO_3$ phase, the $In_2O_3$ phase and the $SnO_2$ phase, respectively, identified by X-ray diffractometry.

For diffraction peaks obtained by X-ray diffractometry of the oxide sintered body, these compound phases have crystal structures described in 21-0334, 71-2194 and 77-0447 of ICDD (International Center for Diffraction Data) cards (corresponding to the $InGaO_3$ phase, the $In_2O_3$ phase and the $SnO_2$ phase, respectively).

The present invention is characterized in that the above oxide sintered body contains the $InGaO_3$ phase in a predetermined ratio, as determined by X-ray diffractometry. When the peak strength ratio of the $InGaO_3$ phase ($[InGaO_3]$) decreases, the cracking of the oxide sintered body during the bonding becomes liable to occur. It is therefore necessary to be 0.05 or more. It is preferably 0.06 or more, more preferably 0.07 or more and still more preferably 0.1 or more. On the other hand, with regard to the upper limit, the higher is the better, from the above viewpoint. For example, it may be 1. However, in consideration of a thermal equilibrium state, it is preferably 0.84 or less, more preferably 0.67 or less and still more preferably 0.5 or less.

The $InGaO_3$ phase is a peculiar phase in which the contents of the metal elements are controlled within the above ranges and which is formed by production under predetermined sintering conditions described later. In the case where the contents of the metal elements or production conditions are different, even when the metal elements constituting the oxide sintered body are the same in kind, crystal phases obtained are different from each other. For example, the $Ga_{3-x}In5_{+z}Sn_2O_{16}$ phase formed in Patent Document 1 (In—Ga—Sn-based oxide sintered body) is not formed in the present invention.

Moreover, also in the case where the metal elements constituting the oxide sintered body are different in kind, crystal phases obtained are different from each other. For example, the $(Ga,In)_2O_3$ phase formed in Patent Document 2 (In—Ga—Zn—Sn—O-based oxide sintered body) is different from the present invention in the ICDD card, although similar to the present invention in notation. This is a phase having a different crystal structure. Moreover, the $(Ga,In)_2O_3$ phase is not formed in the present invention.

The oxide sintered body of the present invention has a relative density of 90% or more. The effect of suppressing the cracking during the bonding can be further improved by increasing the relative density of the oxide sintered body. In order to obtain such an effect, it is necessary that the oxide sintered body of the present invention has a relative density of at least 90% or more. It is preferably 95% or more and more preferably 98% or more. The upper limit thereof is not particularly limited, and may be 100%. However, in consideration of production costs, it is preferably 99%.

Moreover, in order to still further enhance the effect of suppressing the cracking during the bonding, it is necessary to refine the average grain size of grains of the oxide sintered body. Specifically, by controlling the average grain size of the grains observed by a scanning electron microscope (SEM) on a fracture surface (any position of a cut surface when the oxide sintered body is cut at any position in a thickness direction) of the oxide sintered body to 10 μm or less, the cracking of the oxide sintered body can be still further suppressed. The average grain size is preferably 8 μm or less and more preferably 6 μm or less. On the other hand, the lower limit of the average grain size is not particularly limited. However, due to a balance between the refining of the average grain size and production costs, the lower limit of the average grain size is preferably about 0.05 μm.

Moreover, in the present invention, it is preferable to appropriately control not only the average grain size of the oxide sintered body, but also the grain size distribution. Specifically, coarse grains having a grain size exceeding 15 μm cause the cracking of the oxide sintered body during the bonding so that these are preferably as few as possible. The coarse grain is preferably 10% or less, more preferably 8% or less, still more preferably 6% or less, yet still more preferably 4% or less and most preferably 0%.

Next, a method for producing the oxide sintered body of the present invention will be explained.

The oxide sintered body of the present invention is obtained by mixing and sintering an indium oxide, a gallium oxide and a tin oxide. Moreover, the sputtering target of the present invention can be produced by processing the above oxide sintered body. Specifically, the sputtering target can be obtained by subjecting oxide powders to (a) mixing/pulverization→(b) drying/granulation→(c) preforming=(d) degreasing→(e) sintering by hot pressing, and subjecting the oxide sintered body thereby obtained to (f) processing→(g) bonding. Of the above steps, the present invention is characterized in that the conditions of the (e) sintering by hot pressing are suitably controlled as described in detail below. The other steps are not particularly limited, and generally used steps may be suitably selected. Individual steps will be explained below, but the present invention is by no means limited thereto.

Initially, an indium oxide powder, a gallium oxide powder and a tin oxide powder are blended in predetermined ratios, followed by mixing and pulverizing. The material powders to be used preferably each have a purity of about 99.99% or more. This is because an impurity element, if present in a trace amount, may impair semiconducting properties of the oxide semiconductor thin film. The blending ratios of the individual material powders are preferably controlled so as to give ratios falling within the above ranges.

The (a) mixing/pulverization are preferably performed by using a ball mill or a bead mill and placing the material powders together with water therein. A ball or bead to be used in these steps is preferably formed of a material, for example, such as nylon, alumina or zirconia. On this occasion, a dispersant for the purpose of homogeneous mixing, and a binder for securing easiness of the subsequent forming step, may be mixed. The mixing time is preferably 2 hours or more, more preferably 10 hours or more and still more preferably 20 hours or more.

Next, a mixed powder obtained in the above step is preferably subjected to the (b) drying/granulation by means of, for example, a spray drier.

After the drying/granulation, the (c) preforming is performed. For the forming, the powder after the drying/granulation is charged into a die having predetermined dimensions and is preformed through a die press. Since the preforming is performed for the purpose of improving handling properties when set in a predetermined die in the hot pressing step, it should be sufficient to form a compact by applying a pressure of about 49 to 98 MPa. In the present invention, the powder may be directly charged into the forming die and sintered under pressure without performing the preforming through the die press.

In the case where the dispersant or the binder is added to the mixed powder, it is desirable to perform the (d) degreasing by heating the compact for the purpose of removing the dispersant or the binder. The heating conditions are not particularly limited as long as the purpose of degreasing can be achieved. However, for example, the compact may be kept in the air at about 500° C. for about 5 hours.

After the degreasing, the compact is set in the forming die so as to obtain a desired shape, followed by the (e) sintering by hot pressing. As the forming die during the sintering, either a metal die or a graphite die may be used depending on the sintering temperature. However, it is preferable to use the graphite die which is excellent in heat resistance at a high temperature of 900° C. or higher.

In the present invention, after the compact is elevated in temperature to the sintering temperature of 850 to 1250° C., sintering is performed at that temperature for a retention time of 0.1 to 5 hours. By performing the sintering according to these temperature range and retention time, the sintered body can be obtained which has the ratio of the $InGaO_3$ phase satisfying the above expression (4) and a suitable grain size. When the sintering temperature is low, the $InGaO_3$ phase satisfying the above expression (4) cannot be formed. Moreover, the oxide sintered body cannot be sufficiently densified, and the desired relative density cannot be achieved. On the other hand, when the sintering temperature is too high, the grains are coarsened, and the average grain size of the grains cannot be controlled to the predetermined range. Therefore, the sintering temperature is 850° C. or higher, preferably 875° C. or higher and more preferably 900° C. or higher, and is 1250° C. or lower and preferably 1200° C. or lower.

Moreover, when the retention time at the above sintering temperature is too long, the grains grow to be coarsened, so that the average grain size of the grains cannot be controlled to the predetermined range. On the other hand, when the retention time is too short, the above $InGaO_3$ phase cannot be formed in the above-described ratio or more, and a sufficient densification may not occur. Therefore, it is desirable that the retention time is 0.1 hours or more and preferably 0.5 hours or more, and is 5 hours or less.

Also in the present invention, after the preforming, the average temperature-elevating rate to the above sintering temperature is preferably controlled to 600° C./hr or less. When the average temperature-elevating rate exceeds 600° C./hr, abnormal growth of the grains occurs to increase the ratio of the coarse grain. Moreover, the relative density cannot be sufficiently increased. The average temperature-elevating rate is preferably 500° C./hr or less, and more preferably 400° C./hr or less. On the other hand, the lower limit of the average temperature-elevating rate is not particularly limited. However, from the viewpoint of productivity, it is preferably 10° C./hr or more, and more preferably 20° C./hr or more.

In the above sintering step, the pressurization condition during the hot pressing is not particularly limited. However, for example, it is desirable to apply a surface pressure (applied pressure) of 59 MPa or less. When the pressure is too high, the graphite die may be broken. Moreover, an effect of promoting densification is saturated, and it becomes necessary to increase the size of a pressing equipment. On the other hand, when the pressure is too low, densification does not sufficiently proceed in some cases. The preferable pressurization condition is 10 MPa or more, and 39 MPa or less.

In the sintering step, in order to suppress oxidation and disappearance of graphite preferably used as the forming die, an inert gas atmosphere or a vacuum atmosphere is preferably used as the sintering atmosphere. A controlling method of the atmosphere is not particularly limited. For example, the atmosphere may be regulated by introducing Ar gas or $N_2$ gas into a furnace. Moreover, the pressure of the atmosphere gas is desirably controlled to the atmospheric pressure for suppressing evaporation of metal having high vapor pressure. The oxide sintered body obtained as described above has a relative density of 90% or more.

After the oxide sintered body is obtained as described above, the (f) processing→(g) bonding is performed according to common procedures, thereby obtaining the sputtering target of the present invention. A method for processing the oxide sintered body is not particularly limited, and the processing into shapes according to various uses by known methods may be performed.

The sputtering target can be produced by bonding the processed oxide sintered body to a backing plate with a bonding material. The kind of raw material of the backing plate is not particularly limited. However, pure copper or a copper alloy excellent in thermal conductivity is preferable. The kind of the bonding material is also not particularly limited, and various known bonding materials having electric conductivity can be used. For example, an In-based solder material, an Sn-based solder material and the like can be exemplified. A bonding method is also not particularly limited. For example, it may be performed by heating the oxide sintered body and the backing plate at a temperature at which the bonding material melts, for example, about 140 to 220° C., melting it, applying the bonding material melted onto a bonding surface of the backing plate, attaching the individual bonding surfaces to each other, and pressing both onto each other, followed by cooling.

In the sputtering target obtained by using the oxide sintered body of the present invention, the cracking due to stress or the like developed by shock, thermal history or the like during the bonding operation does not occur. Moreover, the resistivity is also very satisfactory, and is preferably 1 $\Omega \cdot cm$ or less, more preferably $10^{-1}$ $\Omega \cdot cm$ or less, and still more preferably $10^{-2}$ $\Omega \cdot cm$ or less. When the sputtering target of the present invention is used, it becomes possible to perform the deposition with the further suppression of the abnormal discharge during the sputtering and the cracking of the sputtering target material, and physical vapor deposition (sputtering method) using the sputtering target can be efficiently performed in production lines of display devices. Moreover, the oxide semiconductor thin film obtained also shows good TFT properties.

The present application claims the benefit of priority based on Japanese Patent Application No. 2013-247763 filed on Nov. 29, 2013. The entire contents of the specification of Japanese Patent Application No. 2013-247763 filed on Nov. 29, 2013 are incorporated in the present application by reference.

EXAMPLES

The present invention will be explained in further detail below with reference to Examples. The present invention is not limited to the following Examples, and it is possible to carry out the present invention with appropriate changes within the range where they are adaptable to the gist of the present invention. All of them fall within the technical scope of the present invention.

Example 1

(Preparation of Sputtering Target)

An indium oxide powder ($In_2O_3$) having a purity of 99.99%, a gallium oxide powder ($Ga_2O_3$) having a purity of 99.99% and a tin oxide powder ($SnO_2$) having a purity of 99.99% were blended in mass ratios and atomic ratios shown in Table 1, and water and a dispersant (ammonium polycarboxylate) were added thereto, followed by mixing in a nylon ball mill for 20 hours. Then, the mixed powder obtained in the above step was dried and granulated.

After the powder thus obtained was preformed through a die press under the following conditions, the temperature was elevated to 500° C. in the air atmosphere under normal pressure, followed by retention at that temperature for 5 hours, thereby performing degreasing.

(Conditions of Preforming)

Forming pressure: 1.0 ton/cm$^2$

Size of compact when the thickness is taken as t: φ 110 mm×t 13 mm

The resulting compact was set in a graphite die and hot pressing was performed under conditions A to F shown in Table 2. On this occasion, $N_2$ gas was introduced into a hot pressing furnace, and sintering was performed in an $N_2$ atmosphere.

The resulting oxide sintered body was machine-processed into φ 100 mm×t 5 mm. After the oxide sintered body and a Cu backing plate were elevated in temperature up to 180° C. spending 10 minutes, the oxide sintered body was bonded to the backing plate by using a bonding material (indium) to prepare a sputtering target.

(Measurement of Relative Density)

The relative density was determined by subtraction of the porosity measured as below. First, a sample was prepared in which a fracture surface (any position of a cut surface when the oxide sintered body was cut at any position in a thickness direction) of the oxide sintered body was mirror-polished. Next, a photograph was taken at a magnification of 1000 times by using a scanning electron microscope (SEM), and the area ratio (%) of pores occupying a 50 μm square was measured and taken as the porosity. With regard to the above sample, the same operation was performed at 20 positions in total, and the average thereof was taken as the average porosity (%) of the sample. The average relative density was calculated by [100−average porosity], and the results thereof are described in Table 4 as "Relative Density (%)". In this example, when the average relative density thus obtained was 90% or more, it was evaluated as passed.

(Average Grain Size)

"Average Grain Size (μm)" described in Table 4 was measured as shown below. First, a sample was prepared in which a fracture surface (any position of a cut surface when the oxide sintered body was cut at any position in a thickness direction) of the oxide sintered body was mirror-polished. Next, a photograph of the structure thereof was taken at a magnification of 400 times by using a scanning electron microscope (SEM), and a straight line having a length of 100 μm was drawn in an arbitrary direction. The number (N) of grains contained in the straight line was determined, and the value calculated from [100/N] was taken as "the grain size on the straight line". Similarly, 20 straight lines were drawn at such intervals that coarse grains did not overlap with each other (at intervals of at least 20 μm), and the grain sizes on the individual straight lines were calculated. Then, the value calculated from [the sum of the grain sizes on the individual straight lines/20] was taken as "the average grain size of the oxide sintered body". In this example, when the average grain size of the oxide sintered body thus obtained was 10 μm or less, it was evaluated as passed.

(Ratio of Coarse Grain)

"Ratio of Coarse Grain (%)" described in Table 4 was measured as below. First, similarly to the above average grain size, a fracture surface of the oxide sintered body was SEM-observed, and a straight line having a length of 100 μm was drawn in an arbitrary direction. Grains having a length cut off on the straight line of 15 μm or more were taken as the coarse grains. The length L (in the case of the plurality, the sum thereof: μm) occupied by the coarse grains on the straight line was determined, and the value calculated from [L/100] was taken as "the ratio of the coarse grains on the straight line" (%). Similarly, 20 straight lines were drawn at such intervals that coarse grains did not overlap with each other (at intervals of at least 20 μm), and the ratios of the coarse grains on the individual straight lines were calculated. Then, the value calculated from [the sum of the ratios of the coarse grains on the individual straight lines/20] was taken as "the ratio of the coarse grains of the oxide sintered body" (%). In this example, when the ratio of the coarse grain of the oxide sintered body thus obtained was 10% or less, it was evaluated as passed.

(Ratio of $InGaO_3$ Phase)

"$InGaO_3$ Phase (%)" described in Table 4 was measured as below. First, the sputtering target obtained by sputtering was taken out from the backing plate, and a 10 mm square test piece was cut out. The strengths of diffraction lines of crystal phases (diffraction peaks) were measured and determined by the following X-ray diffractometry. Analyzer: "X-ray Diffractometer RINT-1500" manufactured by Rigaku Corporation Analysis Conditions:

Target: Cu

Monochromatization: Use of monochromator ($K_\alpha$)

Target output: 40 kV-200 mA (Continuous Measurement) θ/2θ Scanning

Slits: Divergence: ½°, Scattering: ½°, Receiving: 0.15 mm

Monochromator receiving slit: 0.6 mm

Scanning speed: 2°/min

Sampling interval: 0.02°

Measurement angle (2θ): 5° to 90°

For the thus obtained diffraction peaks of the individual crystal phases, the peaks of the individual crystal phases as shown in Table 3 were identified based on ICDD (International Center for Diffraction Data) cards and the height of the diffraction peaks was measured. As these peaks, among the crystal phases, peaks having sufficiently high diffraction strength and showing less overlap with the peaks of the other crystal phases as far as possible were selected. When the diffraction peak of (h k l)=(1 1 1) of $InGaO_3$ cannot be confirmed, the peak of (h k l)=(−3 1 1) having no overlap is selected, and the peak height determined from (peak height× 2.2) is taken as $I(InGaO_3)$. Measured values of the peak height of designated peaks for the individual crystal phases were each taken as $I(InGaO_3)$, $I(In_2O_3)$ and $I(Sn_2O_3)$, and the peak strength ratio of $[InGaO_3]$ was determined according to the following expression.

$$[InGaO_3]=I(InGaO_3)/(I(InGaO_3)+I(In_2O_3)+I(SnO_2))$$

In this example, when $[InGaO_3]$ thus obtained was 0.05 or more, it was evaluated as passed.

(Cracking during Bonding)

The presence or absence of "Cracking during Bonding" described in Table 4 was measured as below. After the above oxide sintered body machine-processed was heated and bonded to a backing plate, it was visually observed whether cracking occurred on a surface of the oxide sintered body or not. When a crack exceeding 1 mm was confirmed on the surface of the oxide sintered body, it was judged that "cracking" is present. The bonding operation was performed 10 times, and the case where the cracking occurred at least once was evaluated as failed and described as "present" in Table 4. On the other hand, the case where the cracking did not occur even once in 10 times was evaluated as passed, and described as "absent" in Table 4.

These results are described together in Table 4. A column of overall evaluation is provided in the rightmost column of Table 4. OK was attached to the case where all of the above evaluation items were evaluated as passed, and NG was attached to the case where any one thereof was evaluated as failed.

TABLE 2

| Production Conditions No. | Retention Temperature (° C.) | Retention Time (hr) | Average Temperature-Elevating Rate up to Sintering Temperature (° C./hr) | Surface Pressure (kg/cm²) | (MPa) |
|---|---|---|---|---|---|
| A | 1200 | 0.5 | 300 | 300 | 29.4 |
| B | 1000 | 2 | 300 | 300 | 29.4 |
| C | 900 | 2 | 300 | 300 | 29.4 |
| D | 800 | 2 | 300 | 300 | 29.4 |
| E | 1300 | 2 | 800 | 300 | 29.4 |
| F | 1300 | 2 | 300 | 300 | 29.4 |
| G | 1100 | 2 | 300 | 300 | 29.4 |

TABLE 3

| Crystal Phase | ICDD Card No. to Be Referred to | Index of Peak to Be Measured (h k l) | Peak Strength Ratio of Each Phase to Strongest Line |
|---|---|---|---|
| $InGaO_3$ | 21-0334 | (−3 1 1) | 2.2 |
| $InGaO_3$ | 21-0334 | (1 1 1) | 1 |
| $In_2O_3$ | 71-2194 | (4 4 0) | 1 |
| $SnO_2$ | 77-0447 | (1 0 1) | 1 |

TABLE 4

| Sample No. | Composition No. | Production Conditions No. | Relative Density (%) | Average Grain Size (μm) | Ratio of Coarse Grain (%) | $InGaO_3$ Phase (%) | Cracking during Bonding | Overall Evaluation |
|---|---|---|---|---|---|---|---|---|
| 1 | a | B | 99 | 5 | 5 | 15 | absent | OK |
| 2 | b |   | 99 | 7 | 6 | 18 | absent | OK |
| 3 | c |   | 98 | 3 | 3 | 12 | absent | OK |
| 4 | a | A | 95 | 4 | 3 | 10 | absent | OK |
| 5 |   | B | 99 | 5 | 5 | 15 | absent | OK |
| 6 |   | C | 94 | 3 | 2 | 12 | absent | OK |
| 7 | d | B | 94 | 11 | 11 | 4 | present | NG |
| 8 | a | D | 85 | 2 | 0 | 3 | present | NG |
| 9 |   | E | 98 | 13 | 19 | 23 | present | NG |
| 10 |   | F | 90 | 10 | 25 | 18 | present | NG |

TABLE 1

| Component No. | Composition of Target | | | | | |
|---|---|---|---|---|---|---|
|  | Mass % | | | Atomic % | | |
|  | $In_2O_3$ | $Ga_2O_3$ | $SnO_2$ | [In] | [Ga] | [Sn] |
| a | 45.45 | 19.19 | 35.36 | 42.7 | 26.7 | 30.6 |
| b | 32.02 | 21.62 | 46.36 | 30.0 | 30.0 | 40.0 |
| c | 52.15 | 16.68 | 31.17 | 49.4 | 23.4 | 27.2 |
| d | 30.68 | 13.81 | 55.51 | 30.0 | 20.0 | 50.0 |

In the sputtering targets of sample No. 1 to No. 6 which satisfied the preferable composition and production conditions of the present invention, no cracking occurred in the targets, not only during the sputtering, but also during the bonding operation. Moreover, with regard to the relative density and resistivity of the sputtering targets thus obtained, the good results were obtained.

On the other hand, in sample No. 7, which was high in [Sn] and did not satisfy the composition of the present invention, and in sample No. 8 to No. 10, which did not satisfy the production conditions, cracking of the sputtering targets occurred during the bonding operation, under heating conditions at high temperature for a long period of time during the bonding, as shown in Table 4. Then, in these examples, by using the sputtering targets in which no cracking occurred by bonding under such bonding conditions that no cracking occurred in the sputtering targets, the $InGaO_3$ phase (%) described above was measured.

Specifically, sample No. 7 is an example of using steel kind d of Table 1, in which the ratio of [Sn] was high for the composition of the oxide sintered body and did not satisfy the definition of the present invention. As a result, as shown in Table 4, the average grain size was large, the preferable ratio of the coarse grain was high, and further, the peak strength ratio of the $InGaO_3$ phase was also low. In this example, cracking occurred in the oxide sintered body during the bonding operation.

Sample No. 8 is an example of employing production condition D of Table 2, in which the retention temperature during sintering was low, although using steel kind a of Table 1, in which the composition of the oxide sintered body satisfied the definition of the present invention. As a result, as shown in Table 4, the relative density decreased and the peak strength ratio of the $InGaO_3$ phase was also low. In this example, cracking occurred in the oxide sintered body during the bonding operation.

Sample No. 9 is an example of employing production condition E of Table 2, in which the temperature-elevating rate up to the sintering temperature was high and the retention temperature during sintering was high, although using steel kind a of Table 1, in which the composition of the oxide sintered body satisfied the definition of the present invention. As a result, as shown in Table 4, the average grain size was large and the preferable ratio of the coarse grain was high. In this example, cracking occurred in the oxide sintered body during the bonding operation.

Sample No. 10 is an example of employing production condition F of Table 2, in which the retention temperature during sintering was high, although using steel kind a of Table 1, in which the composition of the oxide sintered body satisfied the definition of the present invention. As a result, as shown in Table 4, the average grain size was large and the preferable ratio of the coarse grain was high. In this example, cracking occurred in the oxide sintered body during the bonding operation.

Example 2

In this example, the following experiment was performed, in order to demonstrate utility of the In—Ga—Sn oxide sintered body (IGTO) defined in the present invention, compared with a conventional In—Ga—Zn oxide sintered body (IGZO).

First, using the target of No. 1 of Table 4 in Example 1 described above, pre-sputtering before main deposition and sputtering as main deposition were performed under the conditions below to deposit an oxide semiconductor thin film on a glass substrate. For the purpose of reference, the composition of the target of No. 1 of Table 4 described above (the same as component No. a of Table 1) is described together in No. 1 of Table 5.

Sputtering apparatus: "CS-200" manufactured by ULVAC, Inc.
DC (direct-current) magnetron sputtering method
Substrate temperature: Room temperature
(1) Pre-sputtering
Gas pressure: 1 mTorr
Oxygen partial pressure: $100 \times O_2/(Ar+O_2)=0$ volume %
Deposition power density: 2.5 W/cm²
Pre-sputtering time: 10 minutes
(2) Main deposition
Gas pressure: 1 mTorr
Oxygen partial pressure: $100 \times O_2/(Ar+O_2)=4$ volume %
Deposition power density: 2.5 W/cm²
Film thickness: 40 nm For comparison, by using an IGZO target described in No. 2 of Table 5, an oxide semiconductor thin film was deposited under the same conditions as described above. The atomic ratio of In, Ga and Zn in the above target of No. 2 is 1:1:1. A method for preparing the above IGZO target is as described below.

(Preparation of IGZO Sputtering Target)

An indium oxide powder ($In_2O_3$) having a purity of 99.99%, a gallium oxide powder ($Ga_2O_3$) having a purity of 99.99% and a zinc oxide powder ($ZnO_2$) having a purity of 99.99% were blended in mass ratios and atomic ratios shown in Table 1, and water, a dispersant (ammonium polycarboxylate) and a binder were added thereto, followed by mixing in a ball mill for 20 hours. Then, the mixed powder obtained in the above step was dried and granulated.

After the powder thus obtained was preformed through a die press under the following conditions, the temperature was elevated to 500° C. in the air atmosphere under normal pressure, followed by retention at that temperature for 5 hours, thereby performing degreasing.

(Conditions of Preforming)
Forming pressure: 1.0 ton/cm²
Size of compact when the thickness is taken as t: φ 110 mm×t 13 mm The resulting compact was set in a graphite die and hot pressing was performed under the condition G shown in Table 2. On this occasion, $N_2$ gas was introduced into a hot pressing furnace, and sintering was performed in an $N_2$ atmosphere.

The resulting oxide sintered body was machine-processed into φ 100 mm×t 5 mm. After the oxide sintered body and a Cu backing plate were elevated in temperature up to 180° C. spending 10 minutes, the oxide sintered body was bonded to the backing plate by using a bonding material (indium) to prepare a sputtering target.

For the individual oxide semiconductor thin films thus obtained, the ratios (atomic %) of individual metal elements in the individual thin films were measured by a high-frequency inductively coupled plasma (IPC) method. These results are described in Table 6.

TABLE 5

| | Composition of Target | | | | | | | |
|---|---|---|---|---|---|---|---|---|
| | Mass % | | | | Atomic % | | | |
| No. | $In_2O_3$ | $Ga_2O_3$ | $SnO_2$ | ZnO | [In] | [Ga] | [Sn] | [Zn] |
| 1 | 45.45 | 19.19 | 35.36 | 0.0 | 42.7 | 26.7 | 30.6 | 0 |
| 2 | 44.20 | 29.90 | 0.00 | 25.90 | 33.3 | 33.3 | 0.0 | 33.3 |

TABLE 6

| | Composition of Film Atomic % | | | |
|---|---|---|---|---|
| No. | [In] | [Ga] | [Sn] | [Zn] |
| 1 | 42.7 | 26.7 | 30.6 | 0 |
| 2 | 37.0 | 36.4 | 0.0 | 26.5 |

When the compositions (atomic %) of the targets shown in Table 5 were compared with the compositions (atomic %) of the films shown in Table 6, no composition deviation was observed at all between the target and the film in the IGTO target of No. 1 satisfying the composition of the present invention.

In contrast, in the IGZO target of No. 2 containing Zn, not Sn and not satisfying the composition of the present invention, the composition deviation between the target and the film increased. For details, in No. 2, the Zn ratio in the target of 33.3 atomic % decreased to the Zn ratio in the film of 26.5 atomic % by as much as 6.8 atomic %.

It was therefore demonstrated that when the target of the present invention was used, the film having no composition deviation from the composition of the target could be deposited.

Further, after the individual films were deposited by using the above individual targets, the surface state of the individual targets was visually observed to evaluate the presence or absence of a black deposit. For the purpose of reference, photographs of these are shown in FIG. 1.

As a result, when the IGTO target of No. 1 of the example of the present invention was used, no black deposit was observed on a surface of the target after deposition as shown on the left-hand side in FIG. 1. In contrast, when the IGZO target of No. 2 of the conventional example was used, the black deposit was observed on a surface of the target after deposition as shown on the right-hand side in FIG. 1. When the black deposit is present on the surface of the target as described above, it is separated from the target surface during sputtering to form particles, thereby being likely to cause arching. Therefore, the use of the target of the present invention makes it possible not only to deposit the film having no composition deviation, but also to prevent arching during sputtering. Thus, it was demonstrated to be extremely useful.

The invention claimed is:

1. An oxide sintered body obtained by sintering indium oxide, gallium oxide and tin oxide, wherein
    the oxide sintered body has an indium oxide-gallium oxide-tin oxide-based ternary composition,
    the oxide sintered body has a relative density of 90% or more,
    the oxide sintered body has an average grain size of 10 μm or less,
    the following expressions (1) to (3) of contents of indium [In], gallium [Ga] and tin [Sn] in the oxide sintered body, expressed as atomic percentages (atomic %) relative to the total amount of metal element atoms excluding oxygen, are satisfied:

$$35 \text{ atomic \%} \leq [\text{In}] \leq 50 \text{ atomic \%} \quad (1)$$

$$20 \text{ atomic \%} \leq [\text{Ga}] \leq 30 \text{ atomic \%} \quad (2)$$

$$25 \text{ atomic \%} \leq [\text{Sn}] \leq 45 \text{ atomic \%} \quad (3)$$

the oxide sintered body comprises an $InGaO_3$ phase which satisfies the following expression (4), as determined by X-ray diffractometry:

$$[InGaO_3] \geq 0.05 \quad (4);$$

wherein
    $[InGaO_3] = (I(InGaO_3)/(I(InGaO_3) + I(In_2O_3) + I(SnO_2)))$, and
    $I(InGaO_3)$, $I(In_2O_3)$ and $I(SnO_2)$ are measured values of diffraction intensities of the $InGaO_3$ phase, an $In_2O_3$ phase and an $SnO_2$ phase, respectively, as identified by X-ray diffractometry,
    wherein the oxide sintered body does not contain Zn.

2. The oxide sintered body according to claim 1, wherein a ratio of a coarse grain having a grain size exceeding 15 μm is 10% or less.

3. The oxide sintered body according to claim 1, which has no $Ga_{3-x}In_{5+x}Sn_2O_{16}$ phase, as determined by X-ray diffractometry.

4. The oxide sintered body according to claim 1, which has no $(Ga,In)_2O_3$ phase, as determined by X-ray diffractometry.

5. A sputtering target obtained with the oxide sintered body according to claim 1, which has a resistivity of 1 Ω·cm or less.

6. A method for producing the oxide sintered body according to claim 1, comprising:
    mixing indium oxide, gallium oxide and tin oxide,
    setting the indium oxide, the gallium oxide and the tin oxide in a forming die, then
    elevating the temperature of the forming die to a sintering temperature of 850 to 1250° C., and thereafter
    sintering the indium oxide, the gallium oxide and the tin oxide in a region of the sintering temperature for a retention time of 0.1 to 5 hours under an applied pressure of 59 MPa or less.

7. The method according to claim 6, wherein an average temperature-elevating rate up to the sintering temperature is 600° C./hr or less.

8. The oxide sintered body according to claim 2, which has no $Ga_{3-x}In_{5+x}Sn_2O_{16}$ phase, as determined by X-ray diffractometry.

9. The oxide sintered body according to claim 2, which has no $(Ga,In)_2O_3$ phase, as determined by X-ray diffractometry.

10. A sputtering target obtained with the oxide sintered body according to claim 2, which has a resistivity of 1 Ω·cm or less.

11. A method for producing the oxide sintered body according to claim 2, comprising:
    mixing indium oxide, gallium oxide and tin oxide,
    setting the indium oxide, the gallium oxide and the tin oxide in a forming die, then
    elevating the temperature of the forming die to a sintering temperature of 850 to 1250° C., and thereafter sintering the indium oxide, the gallium oxide and the tin oxide in a region of the sintering temperature for a retention time of 0.1 to 5 hours under an applied pressure of 59 MPa or less.

12. The method according to claim 11, wherein an average temperature-elevating rate up to the sintering temperature is 600° C./hr or less.

13. The oxide sintered body according to claim 1, which has no $Ga_{3-x}In_{5+x}Sn_2O_{16}$ phase, as determined by X-ray diffractometry and which has no $(Ga,In)_2O_3$ phase, as determined by X-ray diffractometry.

14. The oxide sintered body according to claim 1, consisting essentially of sintered indium oxide, gallium oxide and tin oxide.

15. The oxide sintered body according to claim 2, consisting essentially of sintered indium oxide, gallium oxide and tin oxide, which has no $Ga_{3-x}In_{5+x}Sn_2O_{16}$ phase, as determined by X-ray diffractometry and which has no $(Ga,In)_2O_3$ phase, as determined by X-ray diffractometry.

16. The oxide sintered body according to claim 14, which has no $Ga_{3-x}In_{5+x}Sn_2O_{16}$ phase, as determined by X-ray diffractometry and which has no $(Ga,In)_2O_3$ phase, as determined by X-ray diffractometry.

17. The oxide sintered body according to claim 1, consisting of sintered indium oxide, gallium oxide and tin oxide, which has no $Ga_{3-x}In_{5+x}Sn_2O_{16}$ phase, as determined by X-ray diffractometry and which has no $(Ga,In)_2O_3$ phase, as determined by X-ray diffractometry.

18. The oxide sintered body according to claim 17, wherein a ratio of a coarse grain having a grain size exceeding 15 μm is 10% or less.

19. The oxide sintered body according to claim 1, wherein the following expressions (1) to (3) of contents of indium [In], gallium [Ga] and tin [Sn] in the oxide sintered body, expressed as atomic percentages (atomic %) relative to the total amount of metal element atoms excluding oxygen, are satisfied:

$$40 \text{ atomic \%} \leq [In] \leq 50 \text{ atomic \%} \quad (1)$$

$$20 \text{ atomic \%} \leq [Ga] \leq 30 \text{ atomic \%} \quad (2)$$

$$25 \text{ atomic \%} \leq [Sn] \leq 40 \text{ atomic \%} \quad (3)$$

* * * * *